(12) United States Patent
Antonov et al.

(10) Patent No.: US 7,518,194 B2
(45) Date of Patent: Apr. 14, 2009

(54) CURRENT AMPLIFYING INTEGRATED CIRCUIT

(76) Inventors: Sergey Antonov, 1214-40 High Park Ave., Toronto, ON (CA) M6P 2S1; Alexei I Antonov, 1604-40 High Park Ave., Toronto, ON (CA) M6P 2S1

( * ) Notice: Subject to any disclaimer, the term of this patent is extended or adjusted under 35 U.S.C. 154(b) by 361 days.

(21) Appl. No.: 11/419,493

(22) Filed: May 20, 2006

(65) Prior Publication Data

US 2007/0267716 A1 Nov. 22, 2007

(51) Int. Cl.
*H01L 29/00* (2006.01)
*H01L 29/73* (2006.01)

(52) U.S. Cl. .................. 257/370; 257/499; 257/511; 257/555; 257/E21.382

(58) Field of Classification Search ............... 257/499, 257/517, 328, 329, 370, 371, 378, E27.015, 257/E27.067, E27.109, E29.027, E29.066
See application file for complete search history.

(56) References Cited

U.S. PATENT DOCUMENTS

| | | | | | |
|---|---|---|---|---|---|
| 4,048,649 | A | * | 9/1977 | Bohn | 257/378 |
| 4,143,392 | A | * | 3/1979 | Mylroie | 257/273 |
| 4,395,812 | A | * | 8/1983 | Bergeron et al. | 438/189 |
| 5,679,972 | A | * | 10/1997 | Kim | 257/378 |
| 2003/0057480 | A1 | * | 3/2003 | Mathieu | 257/328 |

* cited by examiner

*Primary Examiner*—Sue Purvis
*Assistant Examiner*—William Harriston

(57) ABSTRACT

Present invention proposes a dramatic improvement of CMOS IC technology by providing high speed bipolar current amplifiers compatible with CMOS technological process while retaining the footprint compatible to one of standard CMOS devices. This invention promises further increase of speed of ICs as well as a reduction of power dissipation.

1 Claim, 3 Drawing Sheets

CURRENT AMPLIFYING INTEGRATED CIRCUIT

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

BACKGROUND OF THE INVENTION

Present invention belongs to monolithic integrated circuits and buffers or current amplifiers in particular. For the base of this invention an insulated gate bipolar transistor (IGBT) technology has been taken, as the one which incorporates a field effect transistor (FET) and a bipolar transistor. It is widely known that a FET current ability is modest, so it is used in an IGBT for switching the bipolar transistor on and off, where the latter is able to provide high current characteristics.

However, due to an IGBT architecture, where the base of a bipolar transistor coincides with the drain of a FET in away that the collector of said bipolar transistor is positioned on the other side of the crystal with respect to said FET, it is not possible to achieve a multitude of IGBTs within a single integrated circuit. Switching of an IGBT is slow compare to a FET. Hence, our invention is aimed to allow integration of IGBTs into integrated circuits (IC), and for a significant raise of switching speed of said circuits. In order to achieve said improvements we offer a new architecture of an IGBT, where the drain of a FET is the base of a bipolar transistor and the collector of the bipolar transistor contains the source of the FET. In this way the whole circuit becomes very compact and very convenient to be multiplied within a single integrated circuit. To increase efficiency of the proposed circuit it should be completely isolated with a unipolar reinforced well with the bottom. This reinforced closure will limit the size of our circuit and reduce volume charge leading to a high switching performance. Constant closure voltage (all collectors at a rail voltage) will ensure that a surplus parasitic current goes between the rails rather than influences neighboring circuits.

BRIEF SUMMARY OF THE INVENTION

The invention presents the circuit combining a field induced transistor and a bipolar transistor as integrated structure similar to IGBT. It is an advantage and goal of this invention to provide a current amplifier compatible with modern high density integrated circuits produced by CMOS technology. The invented circuit is functionally compatible in terms of operational speed and switching voltage levels; technologically compatible, meaning modification of CMOS technology should be able to produce simultaneously standard CMOS devices together with devices of this invention; footprint compatible, meaning the circuits of this invention are comparable in size with standard CMOS devices and having a high current drive capability they will increase the overall density of the integrated circuit.

Figure 1:
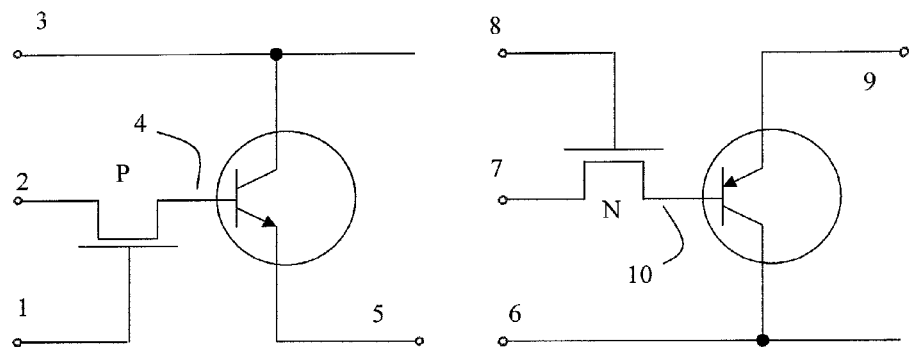
FIG. 1 shows the circuit of this invention ready for use as a current amplifier, such as to replace reading transistors in a memory IC. There are two implementations of the circuit of the invention shown in the drawing. One is for replacement of an N-type field effect transistor and the other one is for replacement of a P-type field effect transistor. For the P-type circuit: The source 2 of the circuit and the gate 1 of the circuit are to be connected in place of the source and gate of the transistor being replaced. The emitter 5 of the circuit is to be connected in place of the drain of the transistor to be replaced. The drain 4 of the FET is the base of the NPN transistor. The collector 3 of the NPN transistor is the well of the FET and connected to a positive power supply rail.

For the N-type circuit: The source 7 of the circuit and the gate 8 of the circuit are to be connected in place of the source and gate of the transistor being replaced. The emitter 9 of the circuit is to be connected in place of the drain of the transistor to be replaced. The drain 10 of the FET is the base of the PNP transistor. The collector 6 of the PNP transistor is the well of the FET and connected to a negative power supply rail.

Figure 2:
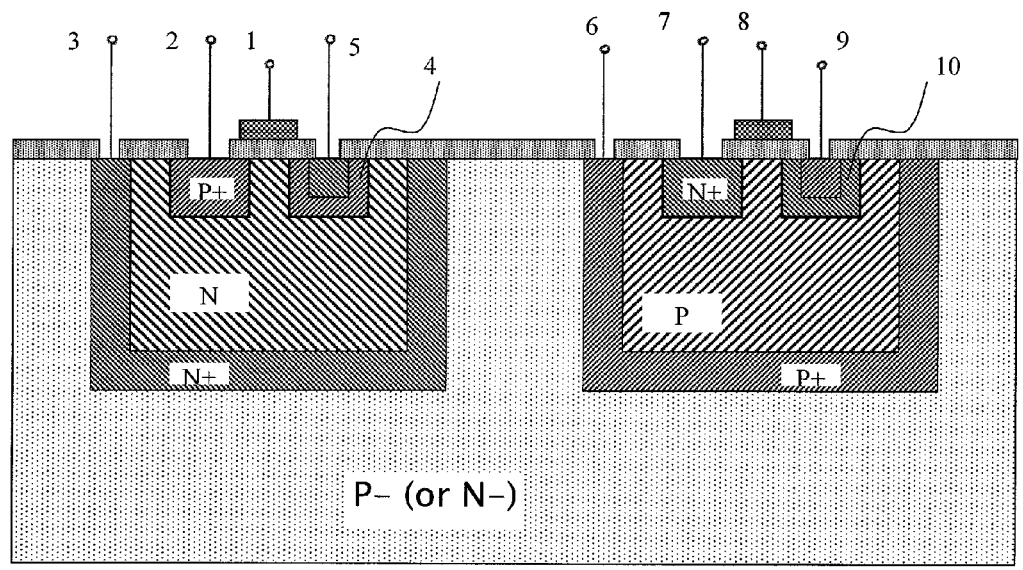

FIG. 2 shows the cross-sections of two types of the circuits of the invention. One is having a P-type collector/well area 6 for the N-type FET and the other one having an N-type collector/well area 3 for the P-type FET. Those cross-sections correspond to the circuits shown in FIG. 1. Emitter regions 5, 9 as they are shown in the drawing are placed inside a semiconductor body within base regions 4, 10; as it is known to those skilled in the art emitters 5, 9 could be formed in additional poly-silicon layer having a direct contact to the base regions 4, 10 as it may be more convenient for manufacturing.

The principle application of the circuit of this invention is an inverting amplifier made into a complimentary configuration.

Figure 3:
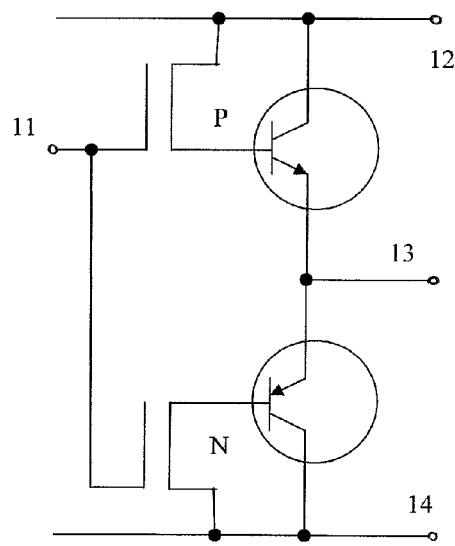

FIG. 3 shows the circuit of this invention as it is employed to form a complimentary inverter circuit such as to replace a CMOS inverter circuit in an IC. The inverter circuit comprises two complimentary circuits of this invention where collectors are connected to power rails 12, 14 and the sources of field effect transistors are connected to their collectors. The input 11 of the inverter is the gates of the field effect transistors connected together as the gates of the inverter being replaced. The emitters connected together form the output 13 of the inverter.

Figure 4:
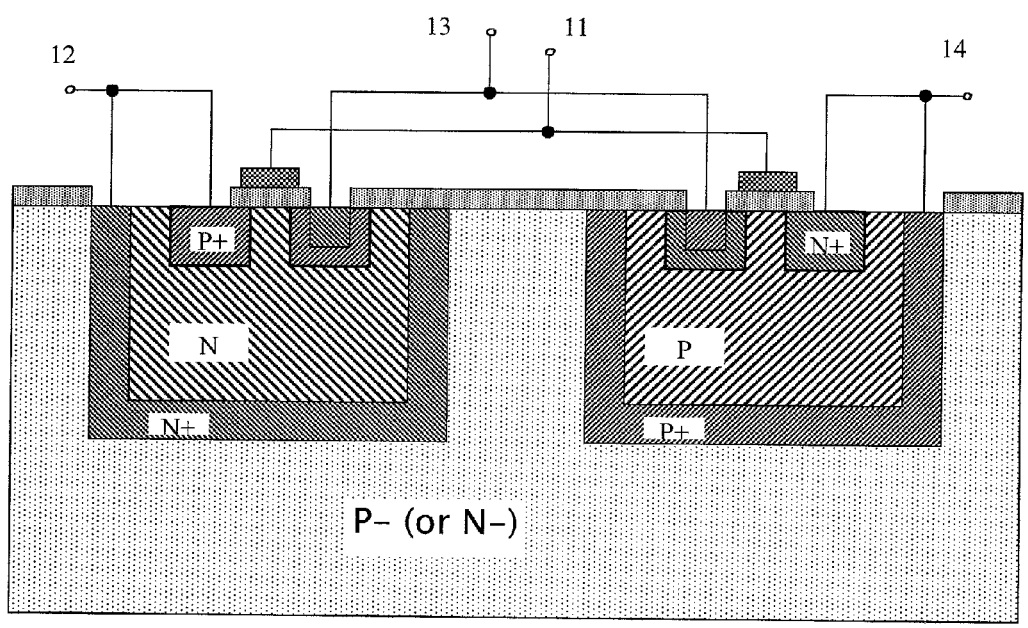

FIG. 4 shows the cross-sections of the inverter utilizing the circuits of the invention. The circuit of first polarity is having a P-type collector/well area 12 and the other one is having an N-type collector/well area 14. Those cross-sections correspond to the circuits shown in FIG. 3. Emitter regions 13 as they are shown in the drawing are placed inside a semiconductor body within base regions; as it is known to those skilled in the art, emitters could be formed in an additional poly-silicon layer having a direct contact to the base regions as it may be more convenient for manufacturing. Each pare of the field effect and bipolar transistors is having its reinforced well/collector region. It is preferred that the well of the inverter or the gate, employing a current amplifier, will be separated by P+ or N+ regions from the well containing adjacent CMOS circuits or other current amplifiers.

Figure 5:
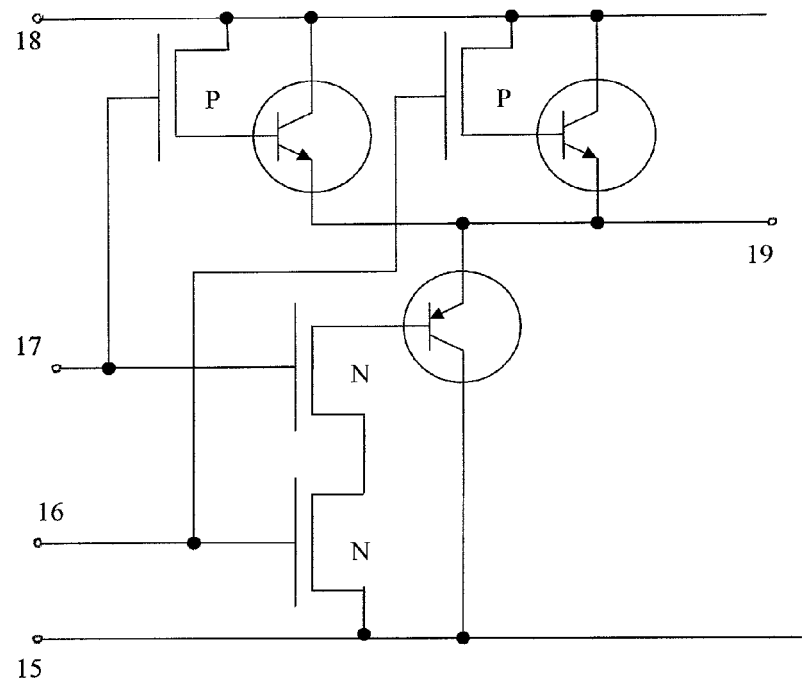

FIG. 5 shows the circuit of this invention as it is employed to form a complimentary NAND circuit such as to replace a CMOS NAND circuit in an IC. The inverter circuit comprises two complimentary circuits of this invention where collectors are connected to power rails 15, 18. The NAND circuit is comprised of four FETs and two bipolar transistors. Those are grouped in complimentary circuits, each including two FETs and one bipolar. One circuit is connected to a positive power rail 18 and contains two P-channel FETs having a common drain which is the base of bipolar transistor. The sources of these FETs are connected to a positive power supply 18. Complimentary circuit is connected to a negative power rail 15 and contains two N-channel FETs so the drain of one FET is the source of another; yet another source is connected to a negative power rail 15 and another drain as the base of a bipolar transistor. The inputs 16, 17 of the circuit are the gates of the field effect transistors connected together as the inputs of the NAND circuit being replaced. The emitters connected together form the output 19 of the NAND circuit.

Figure 6:
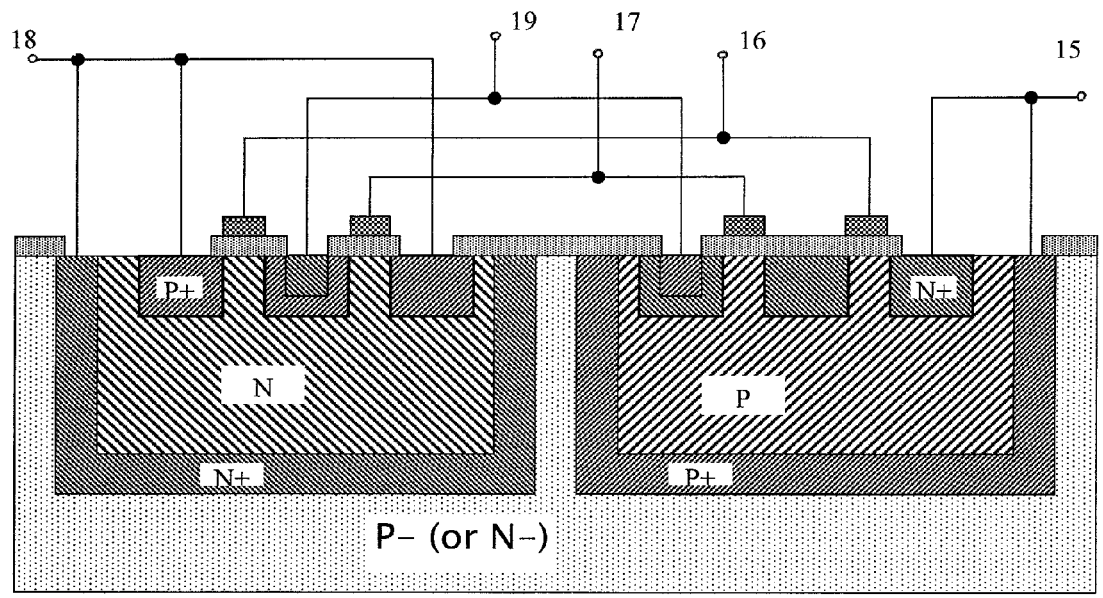

FIG. 6 shows the cross-sections of the NAND circuit utilizing the invention. One is having a P-type collector/well area 15 and another one having an N-type collector/well area 18. Those cross-sections correspond to the circuits shown in FIG. 5. Emitter regions 19 as they are shown in the drawing are placed inside a semiconductor body within base regions; as it is known to those skilled in the art emitters could be formed in an additional poly-silicon layer having a direct contact to the base regions as it may be more convenient for manufacturing.

DETAILED DESCRIPTION OF THE INVENTION

The principle function of the invented circuit is amplification of a field induced transistor current by a bipolar transistor in an emitter follower configuration further connected in a common collector configuration. It is a subject of this invention that the drain of a FET and the base of a bipolar transistor is the same region, while the source of the FET is within the bipolar collector region. This type of arrangement allows to produce the invented circuit or multitude of the circuits within the same semiconductor body. It is also a subject of this invention that the collector of the bipolar transistor is simultaneously a well for the FET and specifically reinforced by a high concentration of impurities. This isolating structure allows to keep the circuit small, therefore gives a high switching speed compatible with a standard CMOS, further allowing to reduce cross talk.

The intended use of the circuit is to replace a standard FET in CMOS ICs when a buffer or high current output is desired: reading transistor in memory arrays, output transistors in CMOS buffers, output transistors in CMOS gates. For memory, higher current would allow faster reading cycles. For CMOS buffers, higher current capability would eliminate a need for bulky multistage circuits. For CMOS gates, an integrated current amplifier would eliminate a need to double the circuit or to buffer it with additional inverters as would be required to improve a fan-out.

To implement these circuits of this invention following modifications to a standard CMOS process would be required: starting with a high purity silicon wafer; create high concentration P+ and N+ areas where the amplifiers would be desired; grow by epitaxy a layer of silicon on the surface of the wafer; create diffusion areas of the same polarity over the perimeter of desired amplifiers (this step might be optional should the standard well-boundary protection diffusion be sufficient to reach the underlying P+ and N+ layers); at this point a standard CMOS process shall continue till the stage when contacts to the source and drain regions are made; in those drain contacts of those amplifiers an additional doping is required to form emitters (optionally an additional poly-silicon layer could be employed should it be found convenient); since the emitters areas are formed, there is no further difference with a standard CMOS process.

It is a broad opinion among those skilled in the art that it is difficult to make a high frequency PNP transistor specifically in structures already having NPN transistors. In this invention we recommend a reinforced type collector/well isolation. P+ areas of the collectors of PNP transistors will limit the charge particles absorbing volume. Same border will reflect said particles coming from outside. Same border of a relatively low resistance will provide a negative rail potential to every point of the border. This will ensure an electric field driven outflow of charge particles. Current invention employs a bipolar transistor and common collector emitter follower configuration, which is self-closing; meaning when output voltage drops to a corresponding rail, current stops. Since emitter current is only present when it is needed to support collector current, there is no functional saturation of the circuit by charge particles. In majority of applications a complimentary configuration is expected; meaning the current tails or volume charges (if any) within one side of the circuit will be cleared by a corresponding complimentary amplifier. At last the proposed invention allows the circuit footprint to be small, thus limiting volume charge.

The principle source of non-common carriers in ICs is a positively driven PN junction. Secondly important is charge released from a FET channel at disconnect. Thirdly, power dissipation and heat define the residual level of non-common carriers in the semi-conductor body. The principle eliminator of non-common carriers is a PN junction at a reversed polarity, secondly is a FET channel area in 'ON' condition. High concentration areas such as P+ and N+ tend to reflect or expel non-common carriers. Medium concentration areas tend to accumulate uncommon carriers and are primary cause for current tails, cross-talk, and latch up in semi-conductor devices. Very low concentration areas as N– and P– tend to accumulate non-common carriers, but allow for relatively good mobility of said particles by electric field. In conclusion, operational areas limited in size and separated by reflecting and conducting high density borders will have limited exposure to non-common carriers from the main body of a semiconductor. The main body of a CMOS IC is traditionally made from very high purity silicon which is exposed to electric field between positive and negative wells. Therefore parasitic surplus non-common carries produced by operating circuit are mainly reflected into the main semi-conductor body where they are moved by electric field to a corresponding well. Upon reaching a PN junction or the area of its own conductivity, non-common carriers are eliminated. The traditional CMOS structure doesn't provide full surface isolation from external non-common carriers. That sometimes allows for small cross-talk or parasitic influence between circuits.

In this invention we propose a comprehensive isolating structure, as required, since we simultaneously propose the use of bipolar current amplifiers—both the source and victim of non-common carriers' contamination.

This invention addresses the need for fast switching, zero stand-by current, bipolar current amplifiers suitable for use in integrated circuits including CMOS. Present invention opens an opportunity to enrich CMOS technology with high speed current amplifiers solving some of persistent problems: slow output and excessive current consumption.

What is claimed is:

1. A monolithic circuit, formed in a body of semiconductor material having flat surface, comprising:
    a bipolar transistor having emitter, base and collector regions;
    at least one MOS-type field effect transistor having source region, drain region and gate structure;

said emitter region positioned within said base region;
said drain and said source regions positioned within said collector region;
the drain region is the base region;
said gate structure including:
a part of the collector between the source and the drain;
a layer of non-conductive material covering said part;
a conductive material covering said layer;
said collector having internal region, peripheral region and bottom region;
said internal region extending to the surface;
said peripheral region extending to the surface around the internal region;
said bottom region extending to the internal region and to the peripheral region;
said peripheral region and said bottom region being formed by impurities of relatively high concentration compare to the concentration of the impurities in the internal region;
said peripheral region and said bottom region forming together complete conductive barrier on all sides of the collector but the surface;
said peripheral region being connected from the surface to a constant electric potential, such as positive or negative power rail.

* * * * *